(12) United States Patent
Chiba et al.

(10) Patent No.: US 6,268,903 B1
(45) Date of Patent: *Jul. 31, 2001

(54) METHOD OF ADJUSTING PROJECTION OPTICAL APPARATUS

(75) Inventors: Hiroshi Chiba, Yokohama; Toshikazu Yoshikawa, Kawasaki, both of (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/581,016

(22) Filed: Jan. 3, 1996

(30) Foreign Application Priority Data

Jan. 25, 1995 (JP) .................................... 7-009687

(51) Int. Cl.⁷ ................................................. H01L 21/027
(52) U.S. Cl. ................................ 355/53; 355/52; 355/77
(58) Field of Search .................................. 355/52, 55, 53, 355/77; 250/201.2, 548, 559.3; 356/355, 356, 124, 399–401, 795

(56) References Cited

U.S. PATENT DOCUMENTS

| | | |
|---|---|---|
| 3,583,790 | 6/1971 | Baker . |
| 4,259,004 | 3/1981 | Tateoka et al. . |
| 4,730,900 | 3/1988 | Uehara et al. . |
| 4,801,808 | * 1/1989 | Hamasaki . |
| 4,883,345 | 11/1989 | Anzai et al. . |
| 4,888,614 | 12/1989 | Suzuki et al. . |
| 4,943,733 | * 7/1990 | Mori et al. . |
| 4,965,630 | 10/1990 | Kato et al. . |
| 4,977,426 | * 12/1990 | Hirose ................................. 355/53 |
| 5,095,386 | 3/1992 | Scheibengraber . |
| 5,105,075 | 4/1992 | Ohta et al. . |
| 5,117,255 | 5/1992 | Shiraishi et al. . |
| 5,136,413 | 8/1992 | MacDonald et al. . |

(List continued on next page.)

FOREIGN PATENT DOCUMENTS

| | | |
|---|---|---|
| 0 307 726 | 3/1989 | (EP) . |
| 0 660 169 | 6/1995 | (EP) . |
| 2 138 163 | 10/1984 | (GB) . |
| 59-144127 | 8/1984 | (JP) . |
| 61-254915 | 11/1986 | (JP) . |
| 62-35619 | 2/1987 | (JP) . |
| 62-35620 | 2/1987 | (JP) . |
| 63-6553 | 1/1988 | (JP) . |
| 63-185024 | 7/1988 | (JP) . |
| 63-232320 | 9/1988 | (JP) . |
| 4-355419 | 12/1992 | (JP) . |
| 5-173065 | 7/1993 | (JP) . |
| 5-251303 | 9/1993 | (JP) . |
| 6-5490 | 1/1994 | (JP) . |
| 6-349702 | 12/1994 | (JP) . |

OTHER PUBLICATIONS

English–language translation of JP–A–63–6553.

*Primary Examiner*—Joan Pendegrass
(74) *Attorney, Agent, or Firm*—Oliff & Berridge PLC

(57) ABSTRACT

A method adjusts optical performance of a projection optical system for projecting an image of a first object onto a second object. An optical member is provided having a predetermined optical surface, at a predetermined position of the projection optical system. Measurement is made of an aberration having a random aberration component in the projection optical system including the optical member at the predetermined position. A correction shape is obtained to correct the random aberration component. The correction shape is then formed on a correction optical member, and that correction optical member is arranged at the predetermined position of the projection optical system.

44 Claims, 14 Drawing Sheets

U.S. PATENT DOCUMENTS

| | | |
|---|---|---|
| 5,260,832 | 11/1993 | Togino et al. . |
| 5,308,991 * | 5/1994 | Kaplan . |
| 5,309,198 | 5/1994 | Nakagawa . |
| 5,350,924 | 9/1994 | Stengl et al. . |
| 5,367,406 * | 11/1994 | Suzuki et al. . |
| 5,392,119 | 2/1995 | McArthur et al. .................. 356/355 |
| 5,432,587 * | 7/1995 | Nozue . |
| 5,459,577 | 10/1995 | Ototake et al. . |
| 5,581,324 | 12/1996 | Miyai et al. . |
| 5,677,757 | 10/1997 | Taniguchi et al. . |
| 5,995,263 * | 11/1999 | Tokuda et al. ....................... 359/196 |

* cited by examiner

Fig. 6
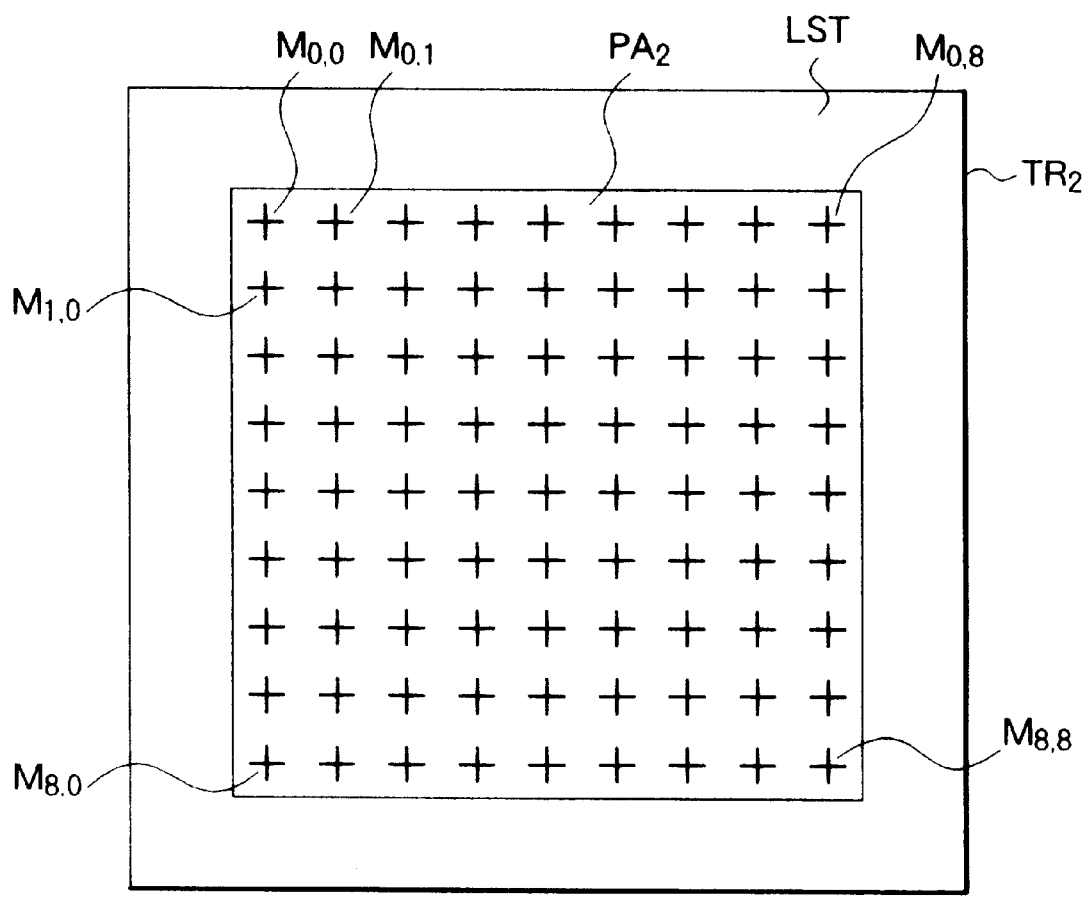
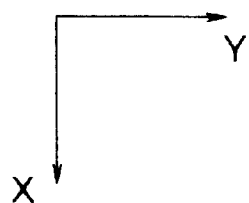

METHOD OF ADJUSTING PROJECTION OPTICAL APPARATUS

BACKGROUND OF THE INVENTION

1. Field of the Invention

The present invention relates to a projection optical apparatus for projecting and exposing the pattern of a first object on a second object and, more particularly, to a method of adjusting the projection optical apparatus.

2. Related Background Art

A projection optical system used in an exposure apparatus that prints a precision circuit pattern on a substrate (wafer, plate, or the like) coated with a photosensitive material requires very high optical performance. For this purpose, optical members used in the projection optical system are manufactured with an ultimately high manufacturing precision.

When manufactured optical members are combined to assemble a projection optical system, very fine adjustment is performed such as adjusting the distances between the respective optical members by changing the thicknesses of washers between lens barrels holding the respective optical members, tilting the optical members (rotating the optical members about, as an axis, a direction perpendicular to the optical axis), or shifting the optical members (moving the optical members in a direction perpendicular to the optical axis), while actually measuring the aberration of the projection optical system. This adjustment minimizes degradation in optical performance which is caused by the manufacturing error of the optical members or which occurs during assembly of the optical members.

SUMMARY OF THE INVENTION

According to the present invention, there is provided an adjusting method having the first step of measuring the residual distortion component of a projection optical system having a predetermined target member in its optical path, the second step of calculating, based on the measurement result of the first step, the surface shape of the target member which cancels the residual distortion component, the third step of removing the target member from the projection optical system and machining the target member so as to have the surface shape calculated in the second step, and the fourth step of inserting the target member machined in the third step into the optical path of the projection optical system.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 1 and 2 are views for explaining the principle of an adjusting method according to the present invention, in which FIG. 1 shows the state of a beam before adjustment, and FIG. 2 shows the state of a beam after adjustment;

FIG. 6 is a plan view showing the arrangement of a test reticle used for measuring distortion;

FIGS. 8 and 9 are graphs for explaining a curved surface interpolation equation of this embodiment, in which FIG. 8 shows a case wherein a conventional curved surface interpolation equation is used, and FIG. 9 shows a case wherein a curved surface interpolation equation of this embodiment is used;

DESCRIPTION OF THE PREFERRED EMBODIMENT

In the conventional projection optical system, distortion components are present that cannot be corrected even by assembly adjustment as described above. Of all the distortion components, regarding in particular a random component (asymmetric distortion) not having a directionality with respect to an optical axis serving as the reference, no effective correcting method is conventionally available for such a random component, and this random component interferes with an improvement in total overlay of a precision printing exposure apparatus.

On the other hand, in the present invention having the above arrangement, as the surface of a target member serving as an optical member partly constituting the projection optical system is machined, a beam that passes through this target member can be deflected by refraction. Thus, an imaging position at a predetermined point on the surface of an object is deflected on an image surface in a direction perpendicular to the optical axis, so that a residual magnification component and a residual distortion component in the projection optical system can be corrected.

Assuming an ideal imaging position of a projection optical system which is an ideal optical system having no aberration, a residual distortion component is a shift amount between the actual imaging position of a beam formed through a target member and a projection optical system, and an ideal imaging position.

Figure 1:
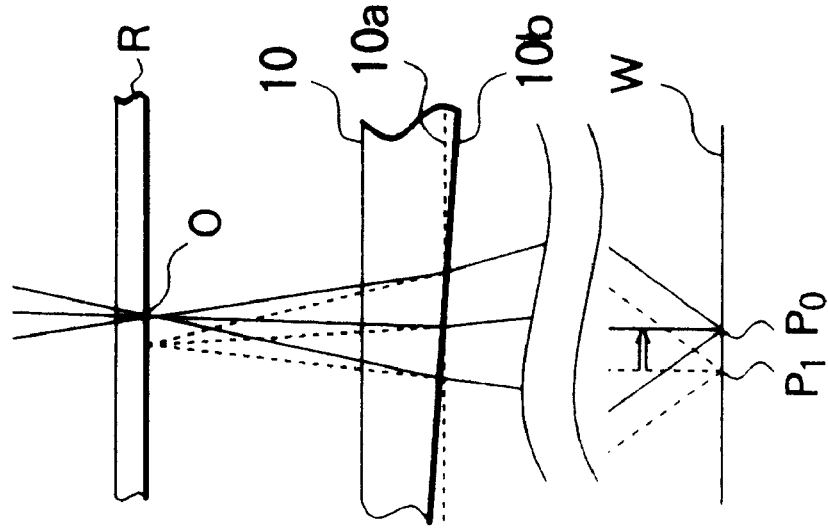

The principle of the present invention will be described with reference to the accompanying drawings. FIG. 1 is a view showing a target member 10 before machining arranged between a reticle R and a wafer W. In FIG. 1, the projection optical system is omitted.

Referring to FIG. 1, a beam emerging from a point O on the reticle R forms an image on the wafer W through the target member 10 and the projection optical system (not shown). When the projection optical system (not shown) has distortion, the beam emerging from the point O on the reticle R is focused on a point $P_1$ to form the image of the point O at the point $P_1$. When the projection optical system (not shown) is an ideal imaging optical system, a beam emerging from the point O on the reticle R is focused on a point $P_0$ to form the image of the point O at the point $P_0$. At this time, the shift between the points $P_0$ and $P_1$ within the surface of the wafer W corresponds to the distortion of the projection optical system.

Figure 2:
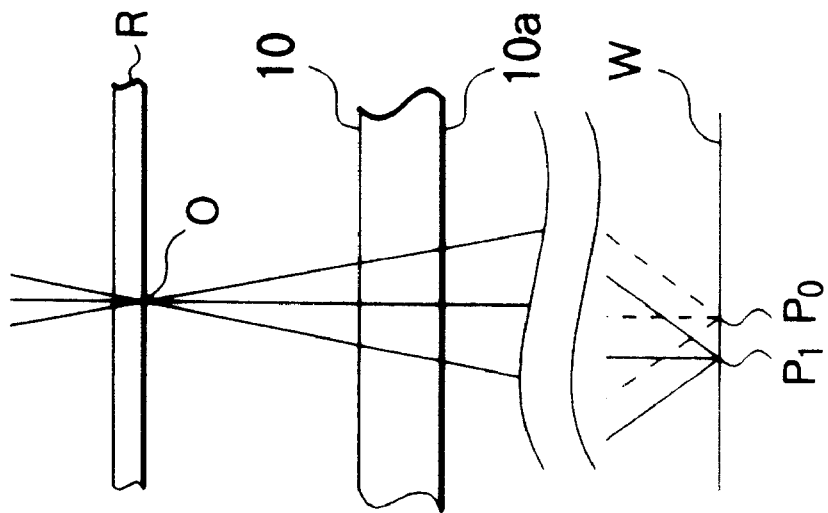

In the present invention, as shown in FIG. 2, the surface of the target member 10 present in the optical path of the projection optical system is machined so that it is changed from a surface 10a before machining to a surface 10b. Then, the beam emerging from the point O on the reticle R is refracted by the surface 10b of the target member 10, and is thus focused on the point $P_0$ on the wafer W. Hence, the distortion of the projection optical system is corrected.

In the present invention, it is desirable that the various aberrations that occur symmetrically with respect to the optical axis are corrected before correction by means of the target member is performed. Then, the machining amount of the target member can be decreased, so that machining becomes easy, and the influence of machining on other aberrations can be prevented.

In the present invention, it is preferable that the projection optical system is constituted to sequentially have a front group, an aperture stop, and a rear group in this order from the object side. At this time, it is preferable that the target member be arranged in one of the front and rear groups, through which a beam having a smaller numerical aperture passes. With this arrangement, the target member is arranged at a position where the beam has a small spot size for the purpose of imaging. Therefore, the control precision of the residual magnification component and the residual distortion component can be further improved. Furthermore, with this arrangement, the influence of the adjusting method of the present invention on other aberration components can be decreased.

The present invention is preferably arranged such that the target member is located in the front or rear group and farthest from the aperture stop. With this arrangement, the target member is provided at a position where the beam has a small spot size for the purpose of imaging. Therefore, the control precision of the residual magnification component and the residual distortion component can be further improved. Furthermore, in this arrangement, since the target member is located at the outermost position (closest to the object or the image) of the projection optical system, the arrangement of the lens barrels of the projection optical system can be simplified, thereby facilitating removed and insertion of the target member in the third and fourth steps.

The present invention preferably satisfies an inequality:

$$d/f<0.07 \tag{1}$$

where d is the distance between an optical member adjacent to a target member and this target member, and f is the focal length of the group in which the target member is located.

This conditional inequality (1) defines the appropriate arrangement of the target member. When this conditional inequality (1) is not satisfied, the operational distance of the projection optical system cannot be sufficiently maintained, which is not preferable. In the conditional inequality (1), it is preferable that the lower limit of d/f be set to 0.001 to satisfy 0.001<d/f. If d/f exceeds this lower limit, it may cause interference between a holding member that holds the target member and a holding member that holds an optical member adjacent to the target member. Then, the degree of freedom in design of the holding members is decreased, which is not preferable.

The present invention preferably satisfies an inequality:

$$-0.005<\Phi<0.005 \tag{2}$$

where $\Phi$ is the refracting power of the target member. The refracting power $\Phi$ of the target member is expressed by $\Phi=1/fa$ where fa is the focal length of the target member.

This conditional inequality (2) defines the range of appropriate refracting powers $\Phi$ of the target member so that the target member can be easily mounted. If the target member has a refracting power exceeding the range of the conditional inequality (2), the decentering allowed for the target member becomes strict. Then, the target member must be positioned (the optical axis of the target member must be adjusted) at high precision, which is not preferable. If the refracting power $\Phi$ of the target member falls within the range of the conditional inequality (2), the influence of aberrations caused by the mounting error of the target member can be decreased, and the positioning precision of the target member can be set to almost equal to the machining precision of the holding member of the target member. When these points and easy machinability are considered, the target member is preferably constituted by a plane-parallel plate having no refracting power.

Figure 3:
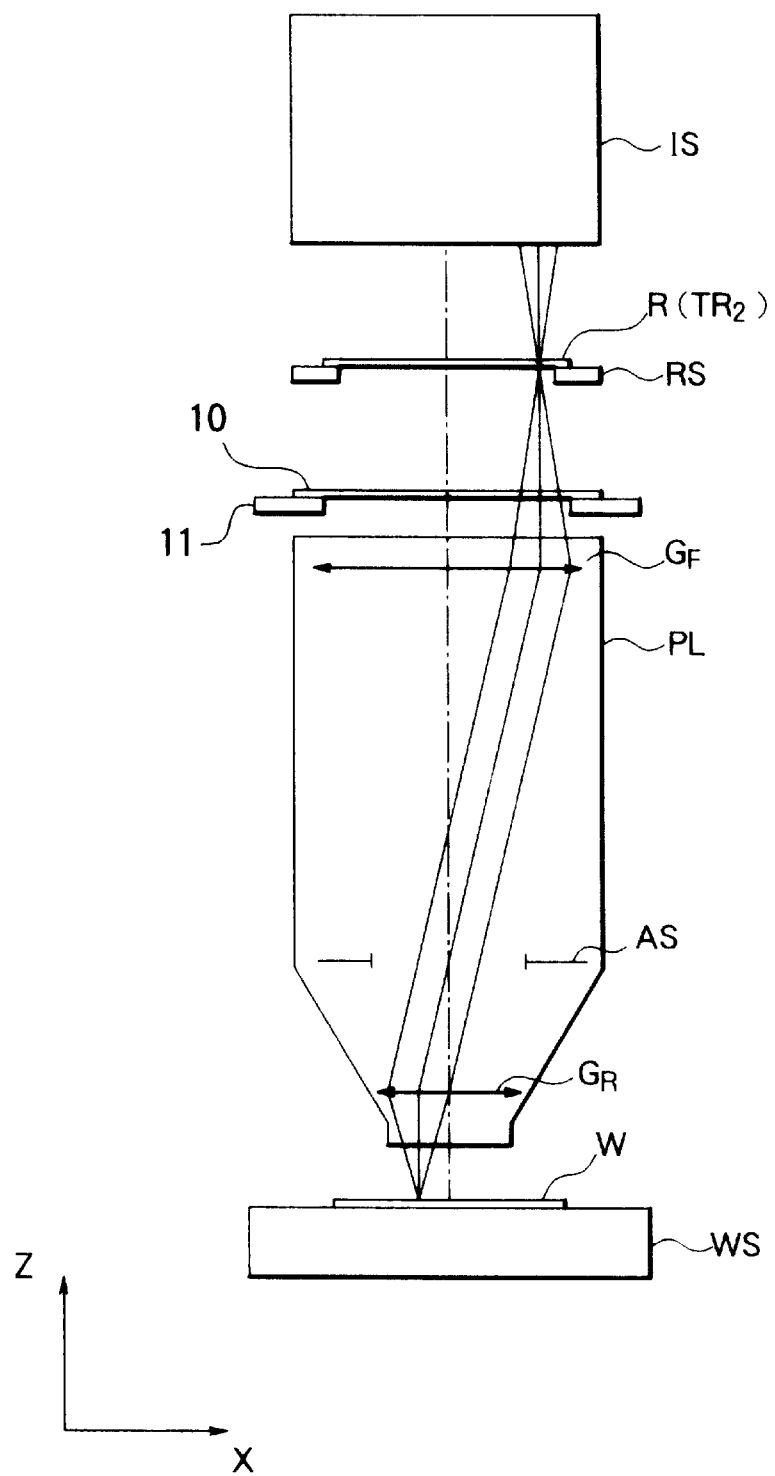
FIG. 3 shows the schematic arrangement of an exposure apparatus to which the adjusting method of the present invention is applied.

The preferred embodiment of the present invention will be described in detail with reference to the accompanying drawings. FIG. 3 is a diagram schematically showing an arrangement of an exposure apparatus suitably applied to a projection optical apparatus of the present invention. The coordinate system is set as shown in FIG. 3.

Referring to FIG. 3, an illumination optical unit IS uniformly illuminates a reticle R placed on a reticle stage RS with exposure light, e.g., a 365-nm i line, a 248-nm KrF excimer laser, and a 193-nm ArF excimer laser. A distortion correction plate 10 serving as the target member, a holding member 11 for placing the distortion correction plate 10 thereon, and a projection objective lens (projection optical system) PL having a predetermined reduction magnification and substantially telecentric on its two sides are provided below the reticle R. The projection objective lens PL sequentially has a front group $G_F$ of positive refracting power, an aperture stop AS, and a rear group $G_R$ of positive refracting power in this order from the reticle R side, and the ratio in refracting power of the front group $G_F$ to the rear group $G_R$ corresponds to the reduction magnification of the projection objective lens PL. In this embodiment, the projection objective lens PL is optically designed such that its aberration is corrected including that of the distortion correction plate 10. Accordingly, light from the reticle R illuminated by the illumination optical unit IS reaches a wafer w placed on a wafer stage WS through the distortion correction plate 10 and projection objective lens PL, and forms a reduced image of the reticle R on the wafer W. This wafer stage WS is movable in the X, Y, and Z directions. In this embodiment, the distortion correction plate 10 is constituted by a plane-parallel plate made of a material, e.g., silica glass, that transmits exposure light therethrough.

Figure 4:
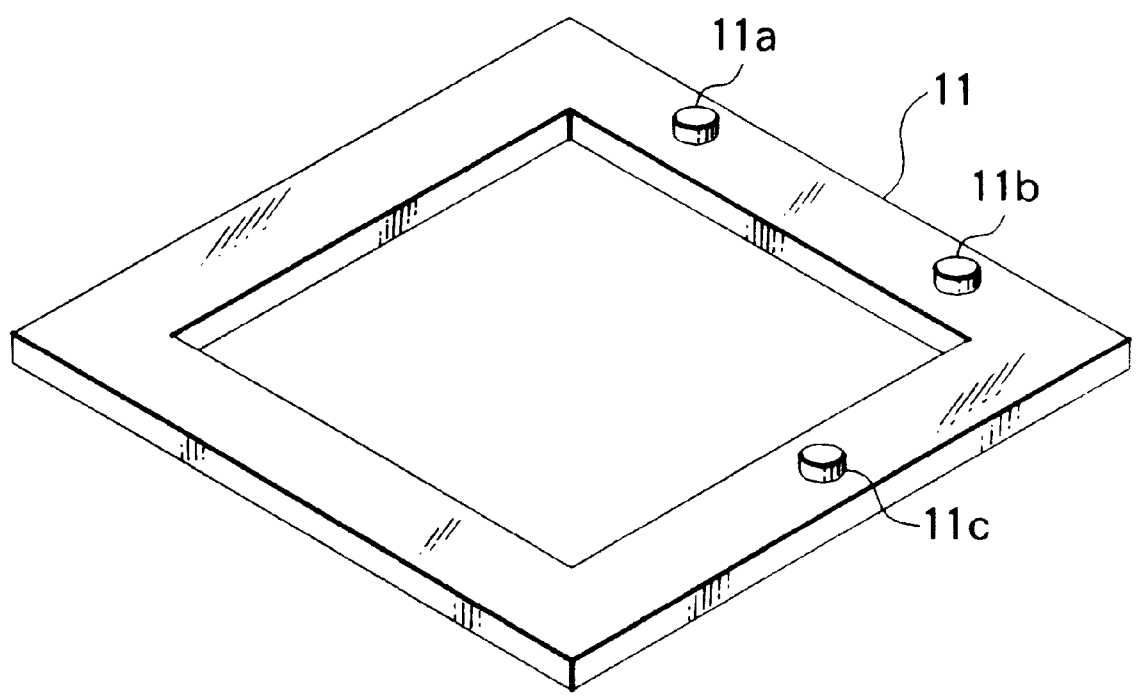
FIG. 4 shows the arrangement of a holding member that holds a distortion correction plate.

As shown in, e.g., FIG. 4, the holding member 11 on which the distortion correction plate 10 is placed has an opening for passing exposure light therethrough, and pins 11a to 11c for regulating the distortion correction plate 10 are provided on part of the holding member 11. Accordingly, when the distortion correction plate 10 is abutted against the pins 11a to 11c, the distortion correction plate 10 is positioned.

Figure 5:
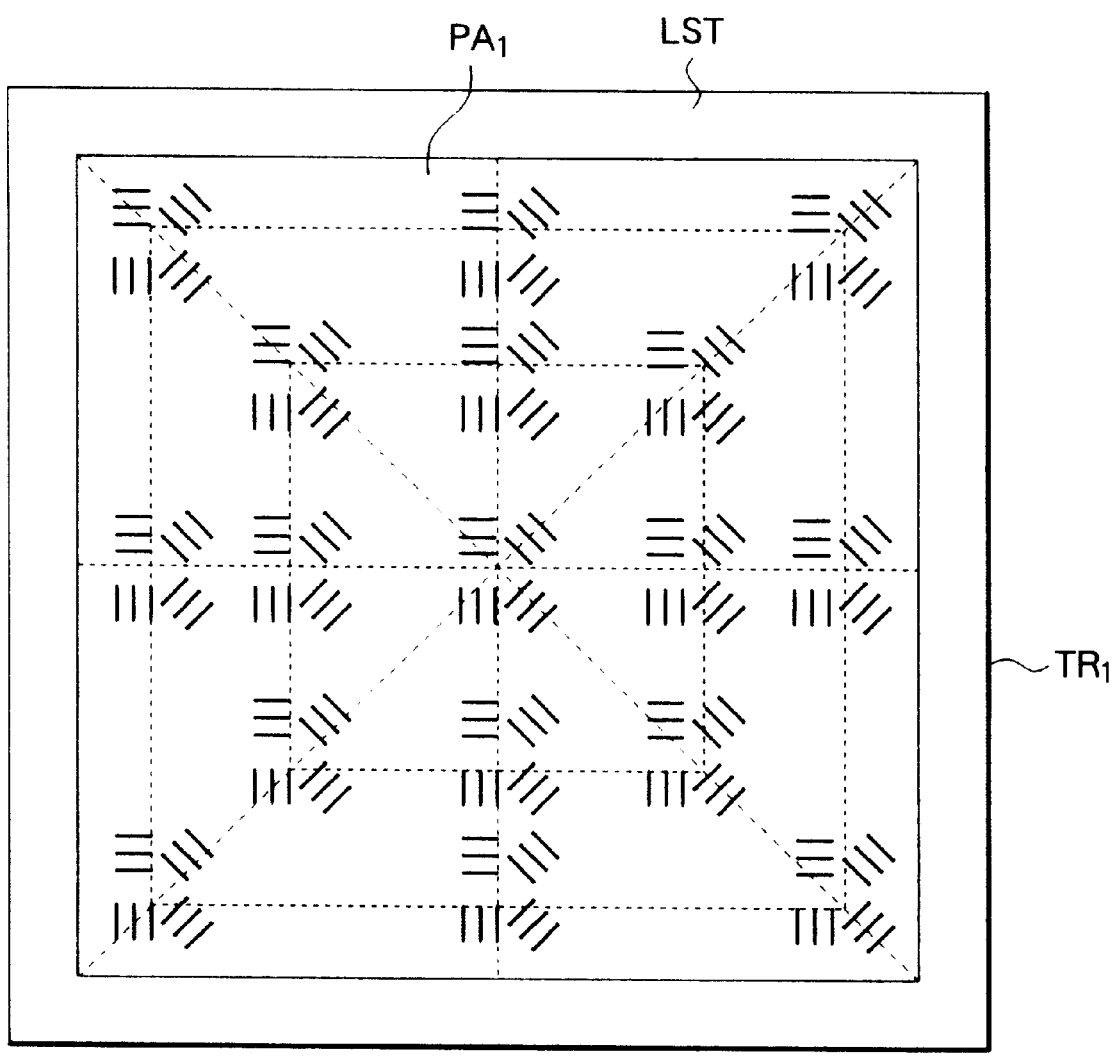
FIG. 5 is a plan view showing the arrangement of a test reticle used for measuring various aberrations other than distortion.

In this embodiment, of the various aberrations of the projection objective lens PL, symmetrical components are corrected prior to the random component of the distortion. First, a test reticle $TR_1$ formed with a predetermined pattern is placed on the reticle stage RS. As shown in, e.g., FIG. 5, the test reticle $TR_1$ has a pattern area $PA_1$ provided with a plurality of marks and a light-shielding band LST surrounding the pattern area $PA_1$. The test reticle $TR_1$ is subjected to Koehler illumination with the exposure light emerging from the illumination optical unit IS. Light emerging from the illuminated test reticle $TR_1$ reaches the wafer w coated with a photosensitive material, e.g., a resist, through the distortion correction plate 10 and projection objective lens PL, and forms the pattern image of the test reticle $TR_1$ on the wafer W. Thereafter, the wafer W is developed, and the resist pattern image obtained by this development is measured by a coordinate measuring machine. The distances between the optical members and the tilt shift of the optical members are adjusted based on the information on the measured resist pattern image, thereby correcting the various aberrations other than the random component of the distortion.

After the various aberrations other than the random component of the distortion are corrected, the random component of the distortion is corrected.

A test reticle $TR_2$ as shown in FIG. 6 is placed on the reticle stage RS in place of the test reticle $TR_1$ used for above correction. The test reticle $TR_2$ has a plurality of cross marks $M_{0,0}$ to $M_{8,8}$ arranged in a matrix form, i.e., arranged on the lattice points of square lattices, within a pattern area $PA_2$ surrounded by a light-shielding band LST that shields exposure light. The cross marks $M_{0,0}$ to $M_{8,8}$ of the test reticle $TR_2$ may be formed on the pattern area $PA_1$ of the test reticle $TR_1$. In other words, both the test reticles $TR_1$ and $TR_2$ may be employed simultaneously.

As shown in FIG. 3, the test reticle $TR_2$ on the reticle stage RS is illuminated with the exposure light of the illumination optical unit IS. Light from the test reticle $TR_2$ reaches the exposure area on the wafer W whose surface is coated with the photosensitive material, e.g., the resist, through the distortion correction plate 10 and projection objective lens PL, and forms the latent images of the plurality of cross marks $M_{0,0}$ to $M_{8,8}$ of the test reticle $TR_2$ on the wafer W. The exposed wafer w is developed, and the plurality of exposed cross marks $M_{0,0}$ to $M_{8,8}$ are patterned.

Figure 7:
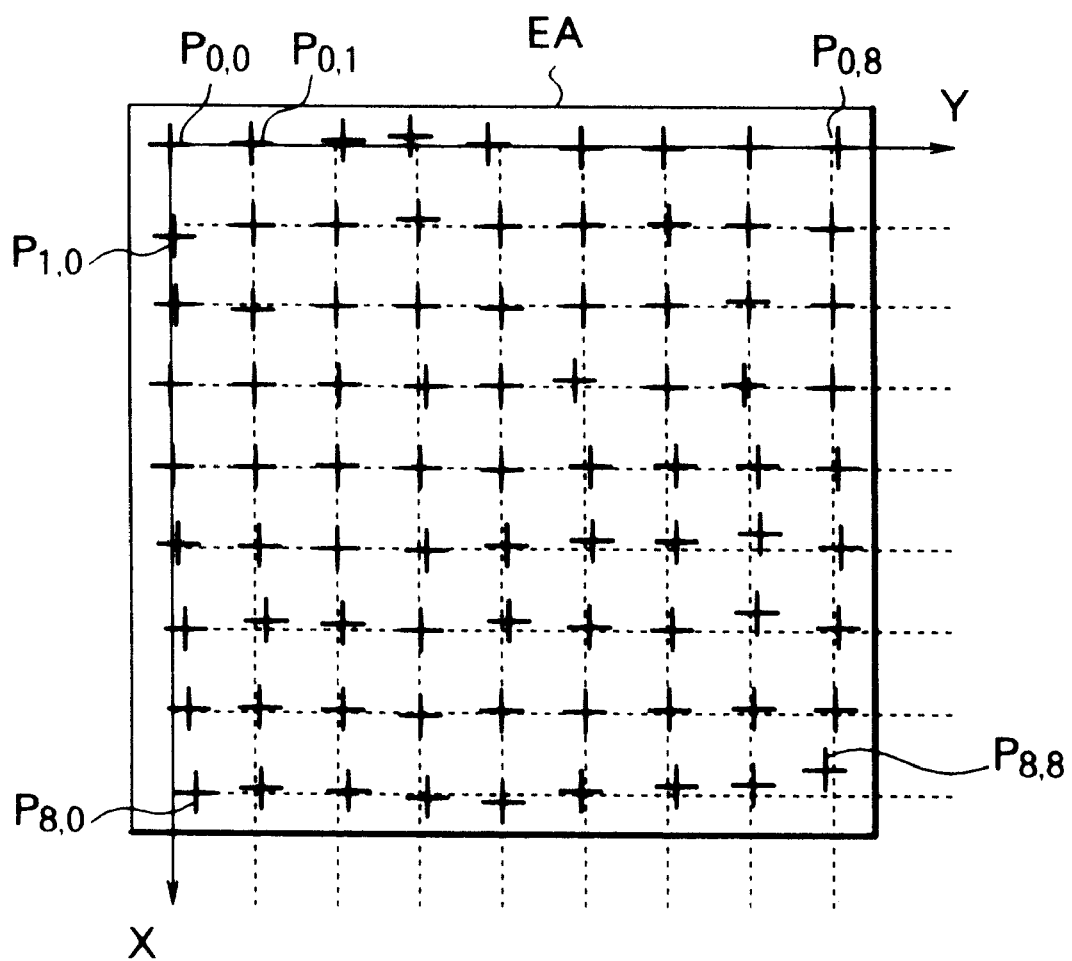
FIG. 7 shows the state of a pattern on a wafer which is formed by using the test reticle shown in FIG. 6.

FIG. 7 shows the plurality of patterned cross marks in an exposure area EA on the wafer W. In FIG. 7, ideal imaging positions where images are formed when the projection optical system is an ideal optical system (an optical system having no aberrations) are expressed by intersection points of broken lines. In FIG. 7, a cross mark $P_{0,0}$ corresponds to the image of the cross mark $M_{0,0}$ on the reticle R, a cross mark $P_{1,0}$ corresponds to the image of the cross mark $M_{1,0}$ on the reticle R, and a cross mark $P_{0,1}$ corresponds to the image of the cross mark $M_{0,1}$ on the reticle R. Any other cross mark $M_{i,j}$ and cross mark $P_{i,j}$ correspond to each other in the same manner.

The X- and Y-coordinates of each of the plurality of cross marks $P_{0,0}$ to $P_{8,8}$ formed on the wafer W are measured by the coordinate measuring machine.

In this embodiment, beams emerging from the plurality of cross marks $M_{0,0}$ to $M_{8,8}$ and focused on the plurality of cross marks $P_{0,0}$ to $P_{8,8}$ are shifted to ideal imaging positions by machining the surface of the distortion correction plate 10. The calculation of the surface shape of the practical distortion correction plate 10 will be described.

As shown in FIG. 3, the distortion correction plate 10 of this embodiment is arranged in the optical path between the projection objective lens PL and the reticle R. This position is a position where a beam having a comparatively smaller numerical aperture (N.A.) passes. Thus, in shifting the imaging positions by the distortion correction plate 10, only shifting of the principal ray of the beam shifted by changing the surface shape of the distortion correction plate 10 need be representatively considered.

A relationship expressed by an equation:

$$w = \beta \cdot L_R \cdot (n-1) \cdot \theta \qquad (3)$$

is established where w is a distortion amount which is a shift amount between the ideal imaging positions and the plurality of cross marks $P_{0,0}$ to $P_{8,8}$ shown in FIG. 7, and $\theta$ is the change amount of angle of the normal to the surface of the distortion correction plate 10 at a principal ray passing point where each of the principal rays from the plurality of cross marks $M_{0,0}$ to $M_{8,8}$ passes through the distortion correction plate 10. The angle change amount $\theta$ concerns the normal to the surface of the distortion correction plate 10 in a reference state before machining, $\beta$ is the lateral magnification of the projection optical system, $L_R$ is a distance between the reticle R and the machining target surface of the distortion correction plate 10 along the optical axis, and n is the refractive index of the distortion correction plate 10. In equation (3), the machining target surface of the distortion correction plate 10 is on the wafer w side.

When the distortion correction plate 10 is located in the optical path between the projection objective lens PL and wafer W, a relationship satisfying an equation:

$$w = L_W \cdot (n-1) \cdot \theta \qquad (4)$$

is established where $L_W$ is a distance between the wafer W and the machining target surface of the distortion correction plate 10 along the optical axis.

Therefore, the plane normals at principal ray passing points on the surface of the distortion correction plate 10 can be obtained from the distortion amount as a shift amount between the coordinates of the plurality of cross marks $P_{0,0}$ to $P_{8,8}$ measured by the coordinate measuring machine described above and the ideal imaging positions.

Although the plane normals at the respective principal ray passing points of the distortion correction plate 10 are determined by the above procedure, the surface of the distortion correction plate 10 cannot be obtained as a continuous surface. Therefore, in this embodiment, a continuous surface shape is obtained from the plane normals at the principal ray passing points of the distortion correction plate 10 that are obtained by the equation (3) or (4), by using a curved surface interpolation equation.

Figure 8:
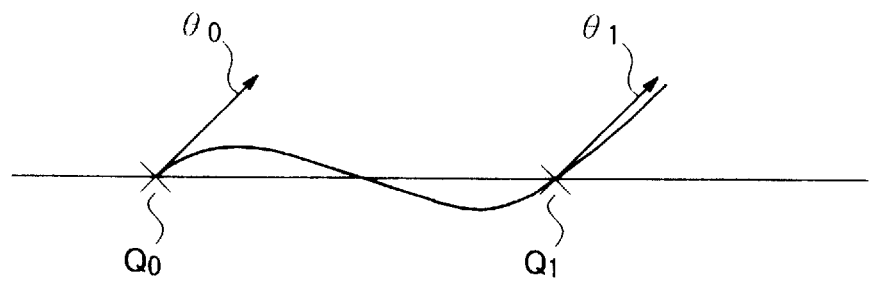

Various types of curved surface interpolation equations are available. In this embodiment, since plane normals are known and the tangential vectors of the surface at the principal ray passing points can be calculated from the plane normals, as the curved surface interpolation equation used in this embodiment, the Coons' equation is suitable which extrapolates a curved surface with the coordinate points and tangential vectors of these coordinate points. For example, however, if the tangential vectors $\theta_0$ and $\theta_1$ of adjacent coordinate points $Q_0$ and $Q_1$ are equal, as shown in FIG. 8, the extrapolated curved line (curved surface) may wave.

In this embodiment, when the distortion amounts caused by the principal rays that pass through adjacent principal ray passing points are equal, it is effective to equalize the distortion amounts of these adjacent principal ray passing points. If the extrapolated curved line (curved surface) waves, as shown in FIG. 8, the amounts and directions of distortion at adjacent principal ray passing points change over time. Then, not only the random component of the distortion cannot be corrected, but also a random component of this type might be further generated undesirably.

Figure 9:
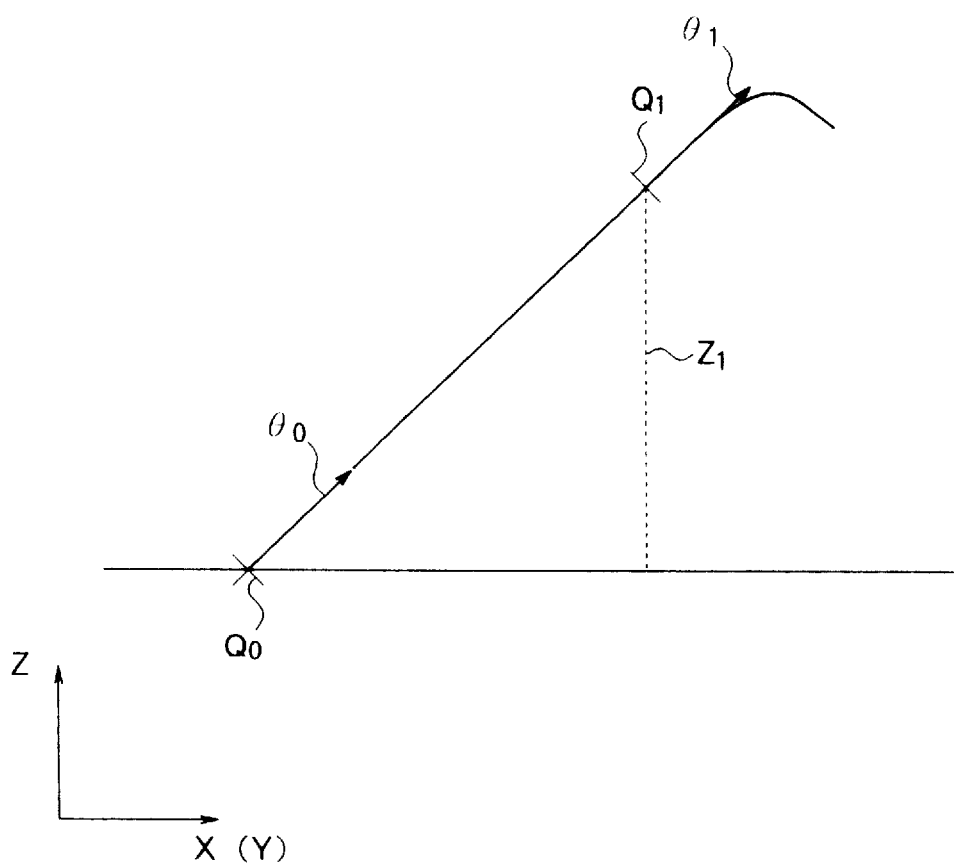

Hence, in this embodiment, in order to equalize the distortion amounts of adjacent principal ray passing points as well, as shown in FIG. 9, the vector component in the Z direction of a tangential vector $\theta_0$ at the coordinate point $Q_0$ is added, as a height $Z_1$ in the Z direction, to the coordinate point $Q_1$ adjacent to the coordinate point $Q_0$. Then, even if the tangential vectors of the adjacent coordinate points $Q_0$ and $Q_1$ are equal, the extrapolated curved line becomes almost linear between these coordinate points $Q_0$ and $Q_1$, and the principal rays passing between these coordinate points $Q_0$ and $Q_1$ are refracted at almost the same angles. Accordingly, when the distortion amounts of the adjacent principal ray passing points are equal, the distortion amounts can be equalized between these points as well.

The procedure of curved surface complement of this embodiment will be described in detail with reference to FIGS. 10 to 14. An X-Y-Z coordinate system is set as shown in FIGS. 10 to 14.

[step 1]

Figure 10:
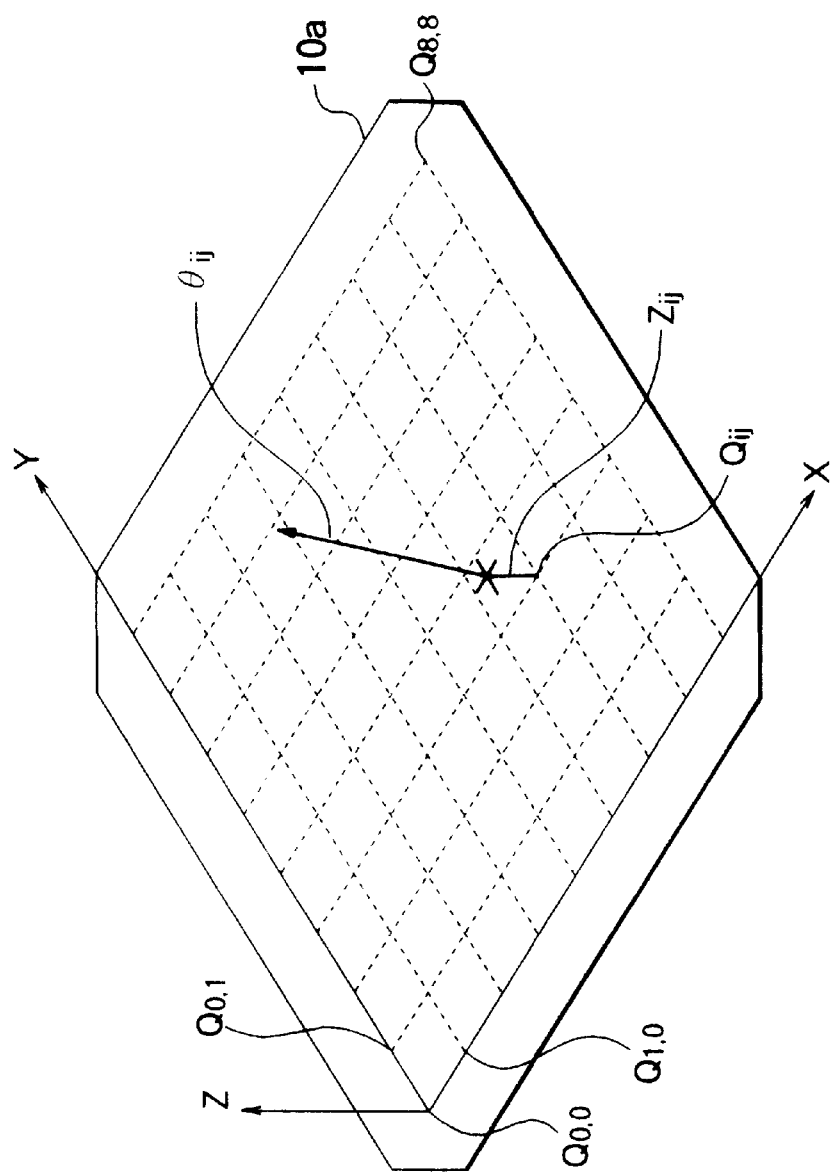
FIGS. 10 to 14 show a curved surface interpolation method of this embodiment.

As shown in FIG. 10, an X-Y-Z coordinate system is defined on a target surface 10a of the distortion correction plate 10. In FIG. 10, principal ray passing points $Q_{0,0}$ to $Q_{8,8}$, through which the principal rays of the beams propagating from the plurality of cross marks $M_{0,0}$ to $M_{8,8}$ shown in FIG. 6 toward the plurality of cross marks $P_{0,0}$ to $P_{8,8}$ shown in FIG. 7 pass, are expressed by intersection points of broken lines. The normal vectors at the respective principal ray passing points $Q_{0,0}$ to $Q_{8,8}$ obtained by the above equation (3) are expressed as $\theta_{i,j}$ (note that in this embodiment i=0 to 8 and j=0 to 8, that is, $\theta_{0,0}$ to $\theta_{8,8}$, and that the X- and Y-components of vector $\theta_{i,j}$ are defined as zero when the direction of the normal vector $\theta_{i,j}$ is equal to the direction of the optical axis), and the heights of the normal vectors in the Z direction at the respective principal ray passing points $Q_{0,0}$ to $Q_{8,8}$ are expressed as $Z_{i,j}$ (note that in this embodiment i=0 to 8 and j=0 to 8, that is, $Z_{0,0}$ to $Z_{8,8}$).

[Step 2]

Figure 11:
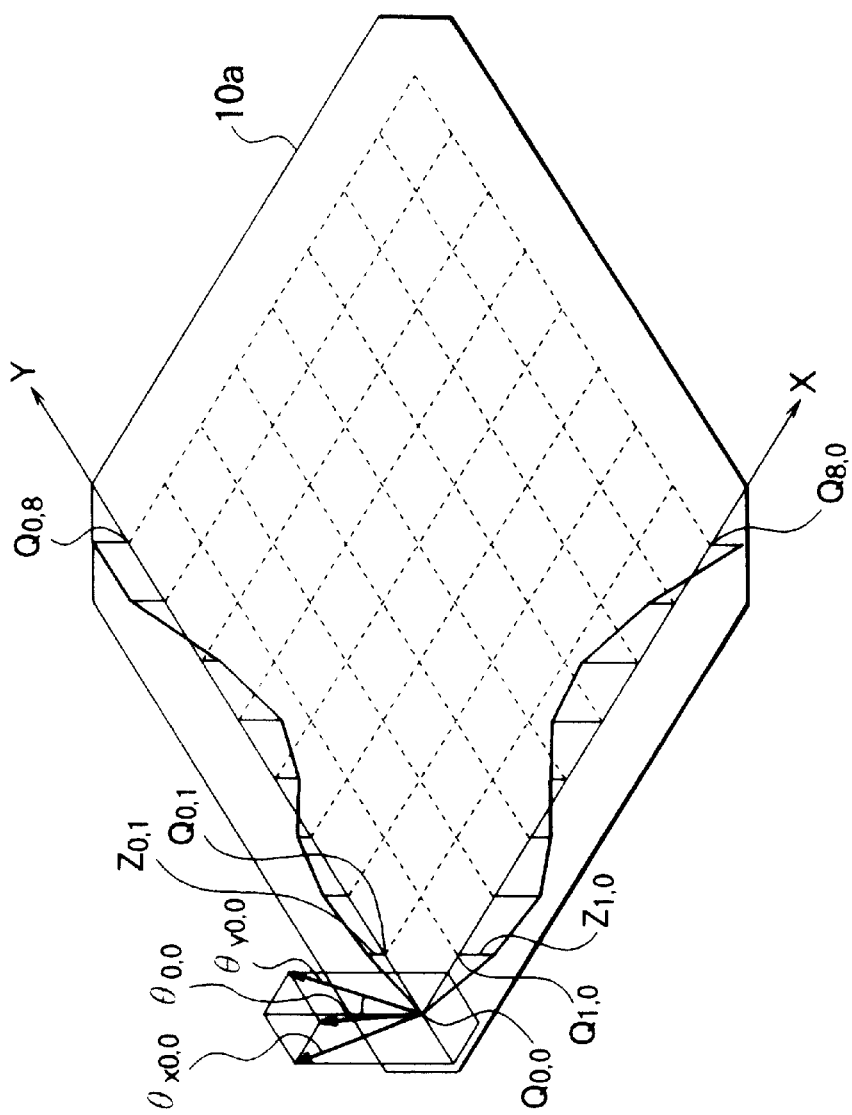

As shown in FIG. 11, of the principal ray passing points, the principal ray passing point $Q_{0,0}$ at the end point of the Y-axis is defined as the reference in the Z-axis direction, and is set as $Z_{0,0}=0$.

[Step 3]

The height $Z_{0,1}$ in the Z direction of the tangential vector at the principal ray passing coordinate point $Q_{0,1}$ adjacent to the principal ray passing point $Q_{0,0}$ on the Y-axis is calculated, based on the normal vector $\theta_{0,0}$ of the principal ray passing point $Q_{0,0}$, by the following equation (5):

$$Z_{0,j}=Z_{0,j-1}+\theta y_{0,j-1}\cdot(y_{0,j}-y_{0,j-1}) \quad (5)$$

where $\theta y_{0,j}$: the vector component in the Y-axis direction of the normal vector $\theta_{0,j}$ at the principal ray passing point $Q_{0,j}$ $y_{0,j}$: the component in the Y-axis direction of the coordinates of the principal ray passing point $Q_{0,j}$ obtained when the principal ray passing point $Q_{0,0}$ is set as the origin.

In step 3, the height $Z_{0,1}$ in the Z direction of the tangential vector at the principal ray passing point $Q_{0,1}$ is calculated based on the above equation (5) as follows $$Z_{0,1}=Z_{0,0}+\theta y_{0,0}\cdot(y_{0,1}-y_{0,0})$$

[Step 4]

The heights $Z_{0,2}$ to $Z_{0,8}$ in the Z direction of the tangential vectors at the principal ray passing points $Q_{0,2}$ to $Q_{0,8}$ on the Y-axis are calculated based on the above equation (5) in the same manner as in step 3.

[Step 5]

The height $Z_{1,0}$ in the Z direction of the tangential vector at the principal ray passing coordinate point $Q_{1,0}$ adjacent to the principal ray passing point $Q_{0,0}$ on the X-axis is calculated, based on the normal vector $\theta_{0,0}$ of the principal ray passing point $Q_{0,0}$, by the following equation (6):

$$Z_{i,0}=Z_{i-1,0}+\theta x_{i-1,0}\cdot(x_{i,0}-x_{i-1,0}) \quad (6)$$

where $\theta x_{i,0}$: the vector component in the X-axis direction of the normal vector $\theta_{i,0}$ at the principal ray passing point $Q_{i,0}$ $x_{i,0}$: the component in the X-axis direction of the coordinates of the principal ray passing point $Q_{i,0}$ obtained when the principal ray passing point $Q_{0,0}$ is set as the origin.

In step 5, the height $Z_{1,0}$ in the Z direction of the tangential vector at the principal ray passing point $Q_{1,0}$ is calculated based on the above equation (6) as follows $$Z_{1,0}=Z_{0,0}+\theta x_{0,0}\cdot(x_{1,0}-x_{0,0})$$

[Step 6]

The heights $Z_{2,0}$ to $Z_{8,0}$ in the Z direction of the tangential vectors at the principal ray passing points $Q_{2,0}$ to $Q_{8,0}$ on the X-axis are calculated based on the above equation (6) in the same manner as in step 5.

[Step 7]

Figure 12:
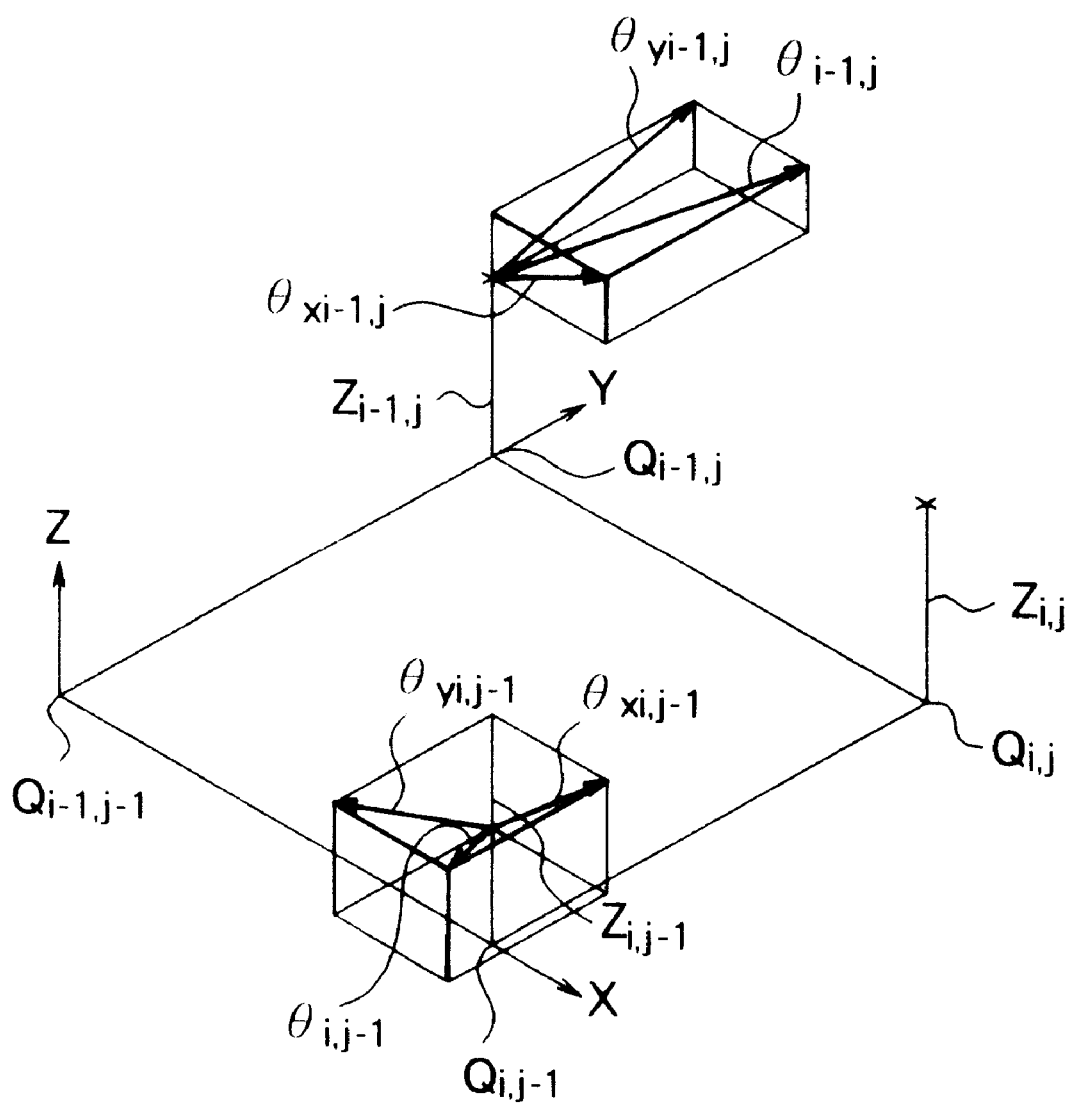

As shown in FIG. 12, the heights $Z_{i,j}$ in the Z direction of the tangential vectors at the principal ray passing points $Q_{1,1}$ to $Q_{8,8}$ located between the X- and Y-axes are sequentially calculated starting with the one closer to the origin $Q_{0,0}$ based on the following equation (7):

$$Z_{i,j}=\{[Z_{i-1,j}+\theta x_{j-1,j}\cdot(x_{i,j}-x_{i-1,j})]+[Z_{i,j-1}+\theta y_{i,j-1}\cdot(y_{i,j}-y_{i,j-1})]\}/2 \quad (7)$$

In step 7, first, the height $Z_{1,1}$ in the Z direction of the tangential vector at the principal ray passing point $Q_{1,1}$ closest to the origin $Q_{0,0}$ is calculated. $Z_{1,1}$ is calculated based on the equation (7) as follows $$Z_{1,1}=\{[Z_{0,1}+\theta x_{0,1}\cdot(x_{1,1}-x_{0,1})]+[Z_{1,0}+\theta y_{1,0}\cdot(y_{1,1}-y_{1,0})]\}/2$$

Figure 13:
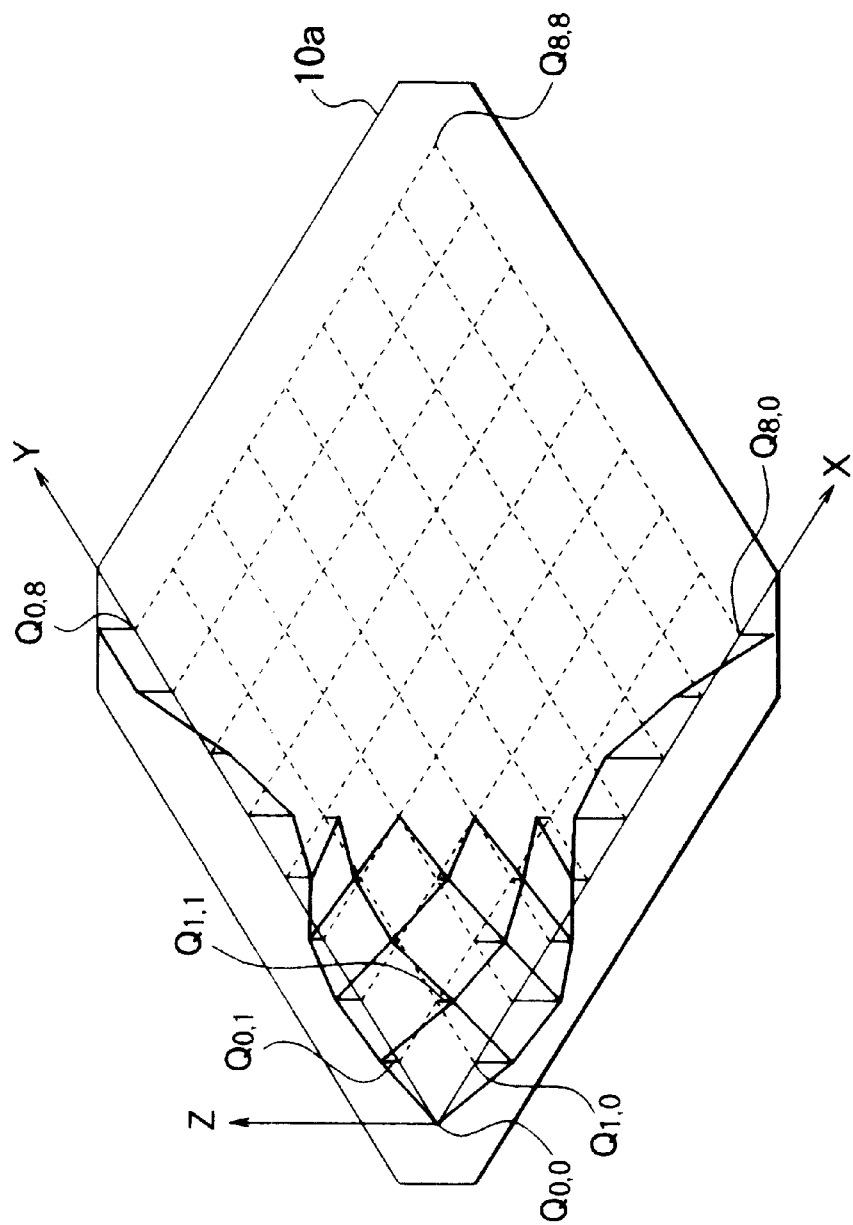

In step 7, as shown in FIG. 13, after the height $Z_{1,1}$ in the Z direction of the tangential vector at the principal ray passing point $Q_{1,1}$ is calculated, the heights $Z_{1,2}$, $Z_{2,1}$, $Z_{2,2}$, ..., $Z_{i,j}$, ..., and $Z_{8,8}$ in the Z direction of the tangential vectors at the principal ray passing points $Q_{1,2}$, $Q_{2,1}$, $Q_{2,2}$, ..., $Q_{i,j}$, ..., and $Q_{8,8}$ are sequentially calculated starting with the one closer to the origin $Q_{0,0}$ based on the above equation (7).

[Step 8]

Based on the heights $Z_{0,0}$ to $Z_{8,8}$ at the principal ray passing points $Q_{0,0}$ to $Q_{8,8}$ obtained through steps 1 to 7, the X- and Y-coordinates of the principal ray passing points $Q_{0,0}$ to $Q_{8,8}$ and the tangential vectors at the principal ray passing points $Q_{0,0}$ to $Q_{8,8}$ obtained from the plane normal vectors $\theta_{0,0}$ to $\theta_{8,8}$ at the principal ray passing points $Q_{0,0}$ to $Q_{8,8}$, a curved surface is formed in accordance with the Coons' patching method. More specifically, the control points of the Coons' patching method are determined as the X-, Y-, and Z-coordinates of the principal ray passing points $Q_{0,0}$ to $Q_{8,8}$ and the tangential vectors of the control points are determined as the tangential vectors calculated from the plane normal vectors $\theta_{0,0}$ to $\theta_{8,8}$ at the principal ray passing points $Q_{0,0}$ to $Q_{8,8}$.

Figure 14:
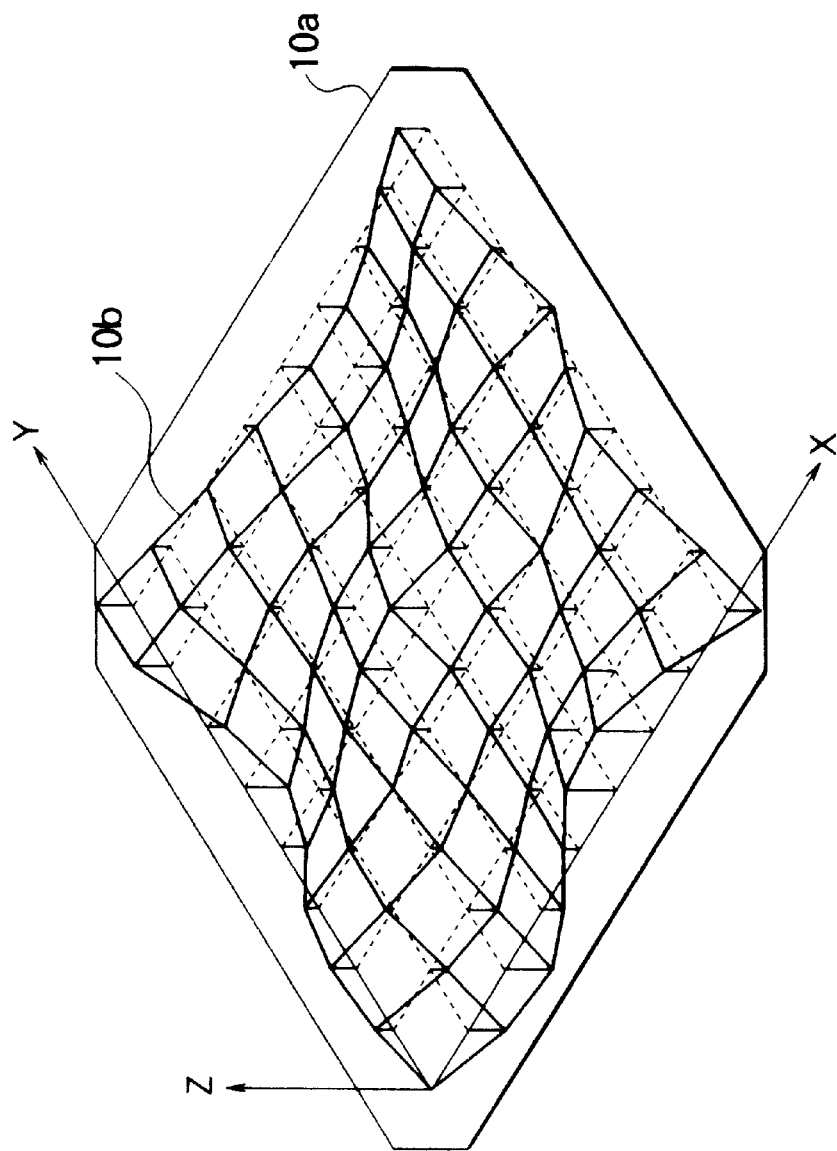

A curved surface as shown in, e.g., FIG. 14, can be obtained by curved surface interpolation in accordance with the Coons' patching method of step 8.

In above steps 1 to 8, the height $Z_{0,0}$ in the Z direction of the tangential vector at the point $Q_{0,0}$ located at the edge of the target surface 10a is set as 0 (step 2), the heights $Z_{0,1}$ $Z_{0,8}$ and $Z_{1,0}$ to $Z_{8,0}$ in the Z direction of the tangential vectors at the points $Q_{0,1}$ to $Q_{0,8}$ and the points $Q_{1,0}$ to $Q_{8,0}$ on the Y- and X-axes, respectively, present at the edges of the target surface 10a are calculated (steps 3 to 6), and thereafter the heights $Z_{i,j}$ (i≠0, j≠0) in the Z direction of the tangential vectors at points other than the points on the Y- and Z-axes are calculated (steps 7 and 8). Thus, farther from the point $Q_{0,0}$, the larger the error in the calculated value, and the sizes of the errors of the calculated values are not symmetric with respect to the central point $Q_{4,4}$ of the target surface 10a through which the optical axis of the projection objective lens PL passes.

For this reason, the heights $Z_{i,j}$ may be calculated in the accordance with the following procedure. First, in step 2, the height $Z_{4,4}$ in the Z direction of the tangential vector at the point $Q_{4,4}$ located at the center of the target surface 10a is defined as 0. In steps 3 to 6, the heights $Z_{4,0}$ to $Z_{4,3}$, $Z_{4,5}$ to $Z_{4,8}$, and $Z_{0,4}$ to $Z_{3,4}$, $Z_{5,4}$ to $Z_{8,4}$ in the Z direction of the tangential vectors at the points $Q_{4,0}$ to $Q_{4,3}$, $Q_{4,5}$ to $Q_{4,8}$, $Q_{0,4}$ to $Q_{3,4}$, $Q_{5,4}$ to $Q_{8,4}$ on axes extending through the central point $Q_{4,4}$ and parallel to the Y- or Z-axis are calculated. Thereafter, in steps 7 and 8, the heights $Z_{i,j}$ (i≠4, j≠4) in the Z direction of the tangential vectors at points other than the points on the axes extending through the point $Q_{4,4}$ and parallel to the Y- or X-axis are calculated.

When the distortion measurement points, i.e., the marks on the test reticles, are not arranged on the lattice points of the square lattices, the heights in the Z direction and the plane normal vectors at lattice points on square lattices located between the respective measurement points are interpolated. More specifically, the height in the Z direction and the plane normal vector at a lattice point can be obtained by summing the heights in the Z direction and the plane normal vectors at a plurality of measurement points surrounding these lattice points while weighting them with the distances between the measurement points and the lattice points.

In above steps 1 to 8, only information inside the distortion measurement points is used. However, in order to further smooth the surface of the distortion correction plate 10 serving as the target member, the lattice points may be set on the outer side (a side remote from the optical axis) of the principal ray passing points corresponding to the distortion measurement points, and the heights in the Z direction and the plane normal vectors at these lattice points may be extrapolated from the height in the Z direction and the plane normal vector at the outermost principal ray passing point.

Figure 15:
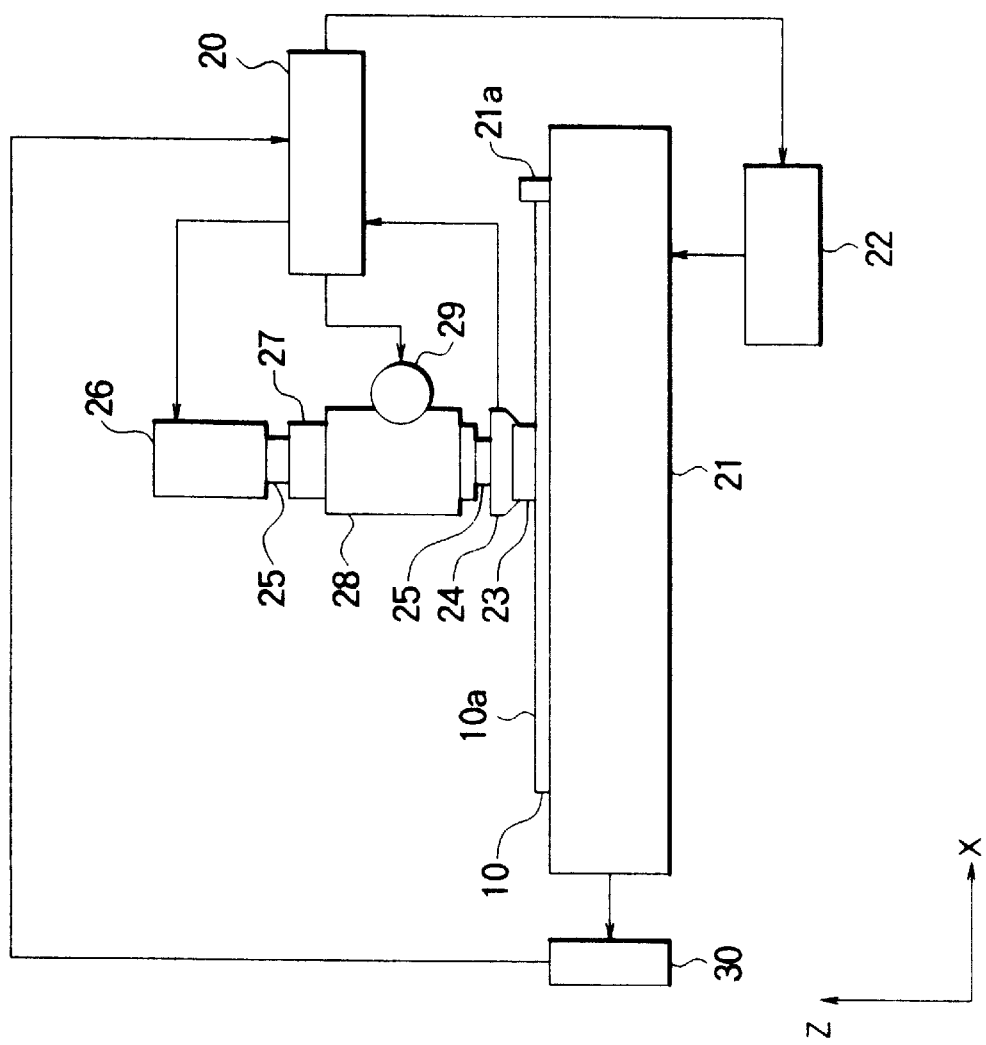
FIG. 15 shows the arrangement of an apparatus that machines the distortion correction plate.

The distortion correction plate 10 is removed from the projection optical apparatus shown in FIG. 3, and the surface of the removed distortion correction plate 10 is machined based on surface shape data of the distortion correction plate 10 which is calculated through steps 1 to 8. The distortion correction plate 10 of this embodiment has a random surface that waves irregularly, in order to correct the random component of the distortion. Accordingly, in this embodiment, a polishing machine as shown in FIG. 15 is used. A coordinate system as indicated in FIG. 15 is employed.

Referring to FIG. 15, the distortion correction plate 10 is placed on a stage 21 movable in the X and Y directions, and the end portion of the distortion correction plate 10 is abutted against a pin 21a on the stage 21. A driver 22 for moving the stage 21 in the X and Y directions is controlled by a controller 20. A detector 30 comprising an encoder, an interferometer, and the like is provided to the stage 21 to detect the position of the stage 21 in the X and Y directions when the stage 21 is moved. A detection signal output from the detector 30 is transmitted to the controller 20.

A polisher 23 is attached to one end of a rotating shaft 25 through a holding portion 24 and is rotatable about the Z direction in FIG. 15 as the rotation axis. A motor 26 controlled by the controller 20 is mounted to the other end of the rotating shaft 25. A bearing 27 that rotatably supports the rotating shaft 25 is provided to a support portion 28 fixed to a main body (not shown) to be movable in the Z direction. A motor 29 controlled by the controller 20 is mounted to the support portion 28. When the motor 29 is operated, the bearing 27 is moved in the Z direction, and accordingly the polisher 23 is moved in the Z direction. The holding portion 24 for holding the polisher 23 is provided with a sensor (not shown) which detects a contact pressure between the abrasion tray 23 and the distortion correction plate 10. An output from this sensor is transmitted to the controller 20.

The operation of the polishing machine shown in FIG. 15 will be briefly described. Surface shape data obtained through steps 1 to 8 is input to the controller 20. Thereafter, the controller 20 moves the stage 21 in the X and Y directions through the driver 22 while it rotates the polisher 23. More specifically, the polisher 23 is moved on the target surface 10a of the distortion correction plate 10 in the X and Y directions. At this time, the amount of abrasion of the target surface 10a of the distortion correction plate 10 is determined by the contact pressure between the target surface 10a and the polisher 23 and the residence time of the polisher 23.

An anti-reflection film is coated, by vapor deposition, on the distortion correction plate 10 machined by the abrading machine shown in FIG. 15, and the machined distortion correction plate 10 is placed on the holding member 11 of the projection optical apparatus shown in FIG. 3. In the polishing machine of FIG. 15, the polisher 23 is fixed in the X and Y directions. However, the polisher 23 may be moved in the X and Y directions in place of moving the stage 21 in the X and Y directions. Alternatively, a small tool (see FIG. 16) may be used in place of the polisher 23.

With this embodiment described above, correction of the random component of distortion, which has conventionally been impossible only with adjustment of the respective optical members constituting the projection optical system, can be performed easily.

In the above embodiment, as the plane-parallel plate having no refracting power is used as the distortion correction plate 10, the decentering precision of the distortion correction plate can be moderated. Then, even if positioning is performed by the holding member 11 as shown in FIG. 4, i.e., even if positioning is determined by the machining precision of the holding member 11, sufficiently high optical performance can be achieved. As the distortion correction plate 10 is a plane-parallel plate, it can be machined easily. When a lens having a predetermined curvature is used as the distortion correction plate 10, this lens preferably has a low refracting power due to the reason described above.

In the above embodiment, as the distortion correction plate 10 is arranged on the reticle R side (enlargement side) where the beam has a smaller numerical aperture, only shift of the principal ray is considered. However, when the distortion correction plate 10 is arranged on the wafer W side (reduction side), the machining amount of the distortion correction plate 10 is preferably determined by considering the influence of the size of the beam on the distortion correction plate 10. Also, in order to further improve the precision of distortion correction, even if the distortion correction plate 10 is arranged on the reticle R side, the machining amount is preferably determined by considering the influence of the size of the beam size on the distortion correction plate 10.

In the above embodiment, the distortion correction plate 10 is mounted in the optical path for measurement to decrease the adverse influence caused by the parts precision of the distortion correction plate 10. However, for measurement, a dummy component different from the distortion correction plate as the target member may be mounted in the optical path. In this case, however, the parts precision of the dummy component must be high.

In the above embodiment, since the distortion correction plate 10 is an optical member which is placed closest to the reticle of all the optical members constituting the projection objective lens PL, the operation of mounting and removing the distortion correction plate 10 in and from the optical path of the projection objective lens PL can be performed easily.

In the above embodiment, the distortion correction plate 10 is positioned with precision which is determined by the machining precision of the holding member 11. In order to perform higher-precision correction, a predetermined mark may be provided to part of the distortion correction plate 10, so that the location of the distortion correction plate 10 with respect to the holding member 11 (with respect to the projection objective system PL) is optically detected. At this time, the mark is desirably provided to the distortion correction plate 10 at a position through which exposure light does not pass.

Figure 16:
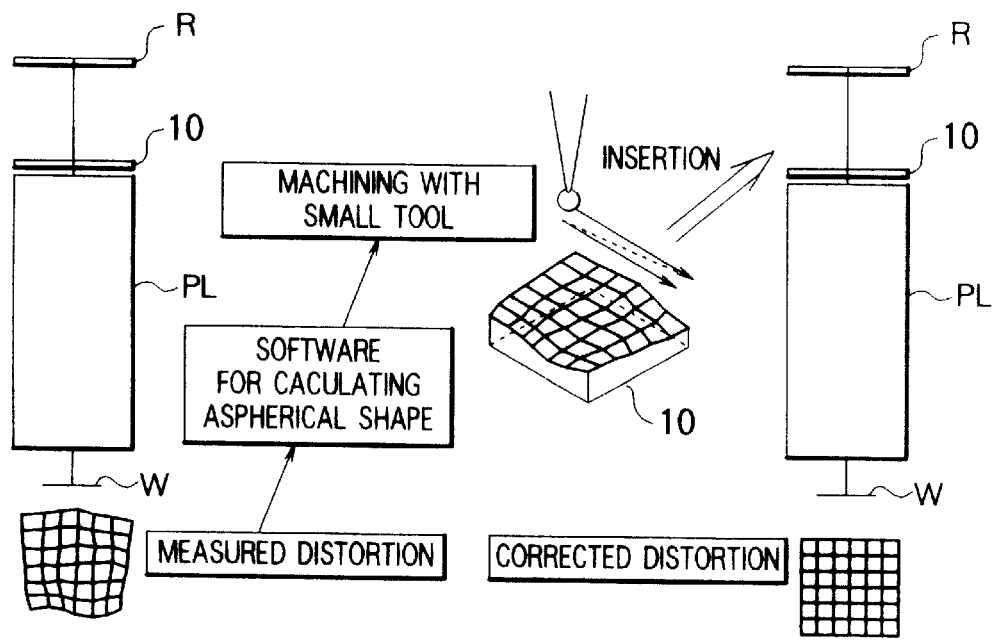
FIG. 16 briefly shows the adjusting method according to the present invention.

FIG. 16 briefly shows the adjusting method of the present invention that has been described so far. In FIG. 16, the distortion correction plate 10 is mounted in the optical path of the projection objective system PL, and the distortion is measured. Subsequently, the shape of the distortion correction plate 10 is calculated based on this measured distortion by using software that calculates an aspherical shape. Thereafter, the distortion correction plate 10 is machined by using a small tool or the like so that it has the calculated shape. When the distortion correction plate 10 machined in this manner is mounted in the optical path of the projection objective system PL again, the distortion on the surface of the wafer W is almost 0.

Figure 17:
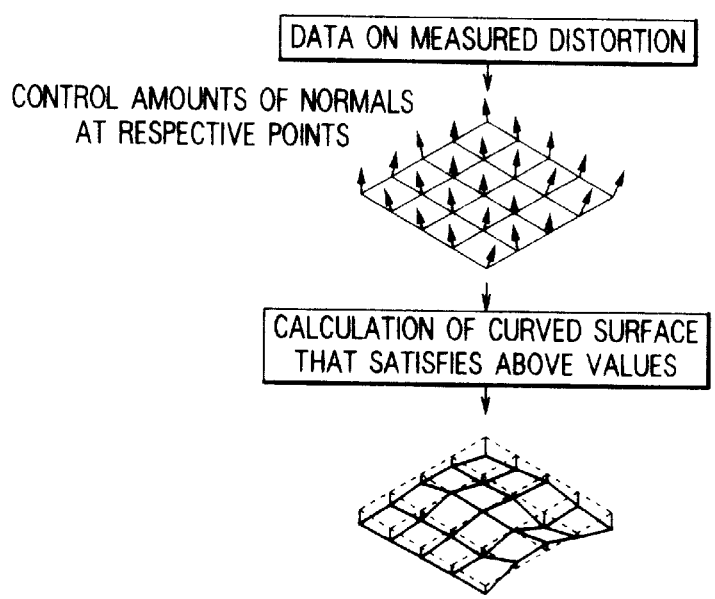
FIG. 17 briefly shows a method of calculating the shape of the distortion correction plate from distortion data.

FIG. 17 briefly shows how to calculate the shape of the distortion correction plate 10 from distortion data. In FIG. 17, the amounts with which the plane normals at the respective points on the distortion correction plate 10 must be controlled are calculated based on the distortion data obtained by measurement. Subsequently, the shape of a curved surface that the machining target should have is calculated such that it satisfies the control amounts calculated in this manner.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of adjusting a projection optical apparatus that projects an image of a first object on a second object, comprising:

the first step of measuring a distortion component of said projection optical apparatus having a projection optical system and a correction optical member which is arranged at a predetermined position with respect to said projection optical system, said correction optical member being constructed by a single optical surface;

the second step of calculating, based on a measurement result of the first step, a surface shape that said correction optical member should have, the distortion component of said projection optical apparatus being canceled to zero when said correction optical member has the surface shape that said correction optical member should have, another aberration component of said projection optical apparatus not being canceled, and the calculation of this step being performed with respect to a single surface of said correction optical member;

the third step of removing said correction optical member from said projection optical apparatus and machining said correction optical member so that the surface shape of said correction optical member coincides with the surface shape calculated in the second step, the machining of this step being performed with respect to said single surface of said correction optical member; and the fourth step of re-arranging said correction optical member machined in the third step at a position where said correction optical member has been arranged in the first step.

2. A method according to claim 1, further comprising the step, executed prior to the first step, of correcting components of various aberrations of said projection optical apparatus that are symmetric with respect to an optical axis of said projection optical system.

3. A method according to claim 1, wherein said projection optical system sequentially has a front group, an aperture stop, and a rear group in an order named from a side of said first object, and a distance between one of said front and rear groups through which a beam having a smaller numerical aperture passes and said correction optical member is smaller than a distance between the other of said front and rear groups through which a beam having a larger numerical aperture passes and said correction optical member.

4. A method according to claim 1, wherein said projection optical system sequentially has a front group, an aperture stop, and a rear group in the order named from the side of said first object, and said correction optical member is arranged at a position close to said front or rear group and farthest from said aperture stop.

5. A method according to claim 4, wherein an inequality $$d/f<0.07$$

is satisfied where f is the focal length of one of said front and rear groups which is closer to said correction optical member, and d is a distance between, of optical members belonging to said group closer to said correction optical member, one closest to said correction optical member and said correction optical member.

6. A method according to claim 1, wherein an inequality $$-0.005<\Phi<0.005$$

is satisfied where $\Phi$ is the refracting power of said correction optical member.

7. A method according to claim 6, wherein the refracting power $\Phi$ of said correction optical member is substantially zero.

8. A method according to claim 7, wherein said correction optical member is a plane-parallel plate.

9. A method according to claim 1, wherein said correction optical member arranged in the first step is a dummy and is different from said correction optical member machined in the third step.

10. A method according to claim 1, wherein the second step comprises:

the step of calculating a normal vector at a first point of a surface shape that said correction optical member should have;

the step of calculating a tangential vector at the first point that concerns a predetermined direction perpendicular to a direction of an optical axis of said projection optical system;

the step of setting a point remote from the first point in the predetermined direction by a predetermined distance as a second point, and calculating a product of an angle defined by the predetermined direction and the tangential vector and the predetermined distance; and the step of adding the product to a height at the first point in the direction of the optical axis of the surface shape that said correction optical member should have, thereby obtaining a height in the direction of the optical axis of the surface shape at the second point.

11. A method according to claim 10, wherein a height is set at a predetermined value at the beginning at a point through which the optical axis of said projection optical system passes, in the direction of the optical axis of the surface shape that said correction optical member should have.

12. A method according to claim 10, wherein a height in the direction of the optical axis of the surface shape that said correction optical member should have is obtained by a plurality of manners by changing the predetermined direction, and a plurality of obtained values are averaged.

13. An exposure apparatus for transferring an image on an original plate onto a photosensitive substrate, comprising:

an illumination optical system for supplying light to said original plate;

a first step for supporting said original plate;

a second stage for supporting said photosensitive substrate; and a projection optical apparatus, having a projection optical system and a correction optical member arranged at a predetermined position with respect to said projection optical system, for causing a position of said original plate supported by said first stage and a position of said photosensitive substrate supported by said second stage to be conjugated, said correction optical member being constructed by a single optical surface, wherein said projection optical apparatus is adjusted by a method comprising:

the first step of measuring a distortion component of said projection optical apparatus;

the second step of calculating, based on a measurement result of the first step, a surface shape that said correction optical member should have, the distortion component of said projection optical apparatus being canceled to zero when said correction optical member has the surface shape that said correction optical member should have, another aberration component of said projection optical apparatus not being canceled, and the calculation of this step being performed with respect to a single surface of said correction optical member;

the third step of removing said correction optical member from said projection optical apparatus and thereafter machining said correction optical member so that the surface shape of said correction optical member coincides with the surface shape calculated in the second step, the machining of this step being performed with respect to said single surface of said correction optical member; and the fourth step of re-arranging said correction optical member machined in the third step at a position where said correction optical member has been arranged in the first step.

14. An exposure apparatus according to claim 13, wherein said projection optical system sequentially has a front group, an aperture stop, and a rear group in the order named from a side of said original plate, and a distance between one of said front and rear groups through which a beam having a smaller numerical aperture passes and said correction optical member is smaller than a distance between the other of said front and rear groups through which a beam having a larger numerical aperture passes and said correction optical member.

15. An exposure apparatus according to claim 13, wherein said projection optical system sequentially has a front group, an aperture stop, and a rear group in the order named from the side of said original plate, and said correction optical member is arranged at a position close to said front or rear group and farthest from said aperture stop.

16. An exposure apparatus according to claim 15, wherein an inequality $$d/f < 0.07$$

is satisfied where f is the focal length of one of said front and rear groups which is closer to said correction optical member, and d is a distance between, of optical members belonging to said group closer to said correction optical member, one closest to said correction optical member and said correction optical member.

17. An exposure apparatus according to claim 13, wherein an inequality $$-0.005 < \Phi < 0.005$$

is satisfied where $\Phi$ is the refracting power of said correction optical member.

18. An exposure apparatus according to claim 17, wherein the refracting power $\Phi$ of said correction optical member is substantially zero.

19. An exposure apparatus according to claim 18, wherein said correction optical member is a plane-parallel plate.

20. A method of adjusting optical performance of a projection system for projecting an image of a first object on a second object, wherein said projection optical system comprising a correction optical member arranged at a predetermined position in said projection optical system, and said correction optical member has a predetermined optical surface in which a correction surface should be formed, said method comprising:

a first step of measuring a residual distortion component of said projection optical system including said correction optical system at said predetermined position;

a second step of obtaining a correction shape for said correction surface which is needed for correcting said residual distortion component of said projection optical system including said correction optical member with respect to said predetermined optical surface of said correction optical member, on the basis of the measuring result obtained in said first step;

a third step of removing said correction optical member from said projection optical system and thereafter machining said optical surface to make said optical surface have said correction shape; and a fourth step of rearranging said machined correction optical member at said predetermined position of said projection optical system.

21. A method according to claim 20, wherein said correction optical member in said first step has a predetermined refracting power.

22. A method according to claim 20, wherein in said first step, measuring of the residual distortion of the projection optical system is performed at a plurality of points on said second object, and said second step of:

a first sub-step of calculating a plurality of residual distortion correction amount needed for correcting residual distortion at said plurality of points;

second sub-step of obtaining local correction shape which is needed for obtaining said plurality of the residual distortion correction amounts at a plurality of positions in a predetermined optical surface of said correction optical member which corresponds to said plurality of the points; and a third sub-step of obtaining a total correction shape of the optical surface of said correction optical member based on said plurality of the local correction shape which are obtained in said second sub-step.

23. An exposure projection apparatus comprising:

illumination device;

said projection optical system adjusted in accordance with a method of claim 20;

a first stage arranged between said illumination device and said projection optical system for defining a reticle on a position of said first object; and a second stage for defining a photosensitive substrate on a position of said second object.

24. A method of making a circuit pattern, using an exposure apparatus according to claim 23, said method comprising the step of printing the circuit pattern on said reticle on said photosensitive substrate.

25. A method of adjusting optical performance of a projection optical system for projecting an image of a first object on a second object, said method comprising:

a first step of providing a correction optical member having a predetermined optical surface, at a predetermined position of said projection system;

a second step of measuring a residual aberration of said projection optical system including said correction optical system at said predetermined position;

a third step of obtaining a correction shape for said correction surface which is needed for correcting said residual aberration of said projection optical system including said correction optical member with respect to said predetermined optical surface of said correction optical member, on the basis of the measuring result obtained in said second step;

a fourth step of removing said correction optical member from said projection optical system and thereafter machining said optical surface to make said optical surface have said correction shape; and a fifth step of rearranging said machined correction optical member at said predetermined position of said projection optical system.

26. A method according to claim 25, wherein said correction optical member is located at a position which is nearest said first object in said projection optical system.

27. A method according to claim 25, wherein said correction optical member in said first step comprising a panel-parallel plate.

28. A method according to claim 25, wherein said correction optical member has a predetermined refractive power.

29. A method according to claim 25, wherein in said second step, measuring of the residual aberration of the projection optical system is performed at a plurality of points on said second object, and said third step of:

a first sub-step of calculating a plurality of residual aberration correction amount needed for correcting residual aberration at said plurality of points;

a second sub-step of obtaining local correction shape which is needed for obtaining said plurality of the residual aberration correction amounts at a plurality of positions in a predetermined optical surface of said correction optical member which corresponds to said plurality of the points; and a third sub-step of obtaining a total correction shape of the optical surface of said correction optical member based on said plurality of the local correction shape which are obtained in said second sub-step.

30. A projection optical system adjusted by a method according to claim 25, wherein said correction optical member is located at a position which is nearest said first object in said projection optical system.

31. A projection optical system adjusted by a method according to claim 25, wherein said correction optical member comprises a panel-parallel plate.

32. A projection optical system adjusted by a method according to claim 25, wherein said correction optical member has a predetermined refractive power.

33. A projection optical system adjusted by a method according to claim 25, wherein in said second step, measuring of the residual aberration of the projection optical system is performed at a plurality of points on said second object, and said third step includes:

a first sub-step of calculating a plurality of residual aberration correction amounts to correct residual aberration at said plurality of points;

a second sub-step of obtaining local correction shapes to obtain said plurality of the residual aberration correction amounts at a plurality of positions in a predetermined optical surface of said correction optical member which corresponds to said plurality of points; and a third sub-step of obtaining a total correction shape of the optical surface of said correction optical member based on said plurality of local correction shapes obtained in said second sub-step.

34. An exposure projection apparatus comprising:

illumination device;

said projection optical system adjusted in accordance with a method of claim 25;

a first stage arranged between said illumination device and said projection optical system for defining a reticle on a position of said first object; and a second stage for defining a photosensitive substrate on a position of said second object.

35. A method of making a circuit pattern, using an exposure projection apparatus according to claim 34, said method comprising the step of printing the circuit pattern on said reticle on said photosensitive substrate.

36. A method of adjusting optical characteristics of a projection optical system which projects an image of a first object on a second object, comprising:

a first step of providing an optical correction member having a predetermined optical surface at a predetermined position of said projection system;

a second step of measuring a residual distortion of said projection optical system including said optical correction member;

a third step of obtaining a correction shape with respect to said predetermined optical surface of said optical correction member, based on a measuring result obtained in said second step;

a fourth step of machining said predetermined optical surface so that said predetermined optical surface has said correction shape, after removing said optical correction member from said projection optical system; and a fifth step of re-arranging said optical correction member machined in said fourth step at said predetermined position in said projection optical system, wherein said method further comprises a sixth step of giving a predetermined mark to said optical correction member, and in said fifth step, said machined optical correction member is positioned based on an optical detection of said mark.

37. A method of adjusting optical characteristics of a projection optical system which projects an image of a first object on a second object, comprising a first step of providing a first optical correction member having a first optical surface at a predetermined position in said projection optical system;

a second step of measuring a residual distortion of said projection optical system including said first optical correction member;

a third step of obtaining a correction shape with respect to said first optical surface of said first optical correction member, based on a measuring result obtained in said second step;

a fourth step of providing a second optical correction member having a second optical surface;

a fifth step of machining said second optical surface so that said second optical surface has said correction shape; and a sixth step of removing said first optical correction member from said projection optical system and thereafter re-arranging said second optical correction member machined in said fifth step at said predetermined position in said projection optical system.

38. A method of adjusting optical performance of a projection optical system for projecting an image of a first object onto a second object, said method comprising:

a first step of providing an optical member having a predetermined-optical surface, at a predetermined position of said projection optical system;

a second step of measuring an aberration having a random aberration component of said projection optical system including said optical member at said predetermined position;

a third step of obtaining a correction shape to correct said random aberration component;

a fourth step of forming said correction shape on a correction optical-member; and a fifth step of arranging said correction optical member at said predetermined position of said projection optical system.

39. A projection optical system for projecting an image of a first object onto a second object, produced by the following method:

a first step of providing an optical member having a predetermined optical surface, at a predetermined position of said projection optical system;

a second step of measuring an aberration having a random aberration component of said projection optical system including said optical member at said predetermined position;

a third step of obtaining a correction shape to correct said random aberration component;

a fourth step of forming said correction shape on a correction optical member; and a fifth step of arranging said correction optical member at said predetermined position of said projection optical system.

40. A projection optical system for projecting an image of a first object onto a second object, said system having an optical performance adjusted by a method comprising:

a first step of providing a correction optical member having a predetermined optical surface, at a predetermined position of said projection optical system;

a second step of measuring a residual aberration of said projection optical system including said correction optical member at said predetermined position;

a third step of obtaining a correction shape for a correction surface to correct said residual aberration of said projection optical system including said correction optical member with respect to said predetenmined optical surface of said correction optical member, on the basis of the measuring result obtained in said second step;

a fourth step of removing said correction optical member from said projection optical system and thereafter machining said optical surface to make said optical surface have said correction shape; and a fifth step of rearranging said machined correction optical member at said predetermined position of said projection optical system.

41. A method of adjusting optical characteristics of a projection optical system which forms an image of a first object onto a second object, the method comprising:

a first step of measuring an aberration of said projection optical system, said aberration includes a symmetrical component and a random component;

a second step of correcting said symmetrical component; and a third step of correcting said random component; said third step comprising a first sub-step of obtaining a correction shape with respect to an optical surface, a second sub-step of machining said optical surface so that said optical surface has said correction shape, and a third sub-step of placing said optical surface at an optical path of said projection optical system.

42. A method according to claim 41, wherein said second step includes a sub-step of tilting or shifting an optical member within said projection optical system.

43. A method according to claim 41, wherein said third step acts after said second step.

44. A projection optical system which forms an image of a first object onto a second object, said system having optical characteristics adjusted by a method comprising:

a first step of measuring an aberration of said projection optical system, said aberration includes a symmetrical component and a random component;

a second step of correcting said symmetrical component; and a third step of correcting said random component; said third step comprising a first sub-step of obtaining a correction shape with respect to an optical surface, a second sub-step of machining said optical surface so that said optical surface has said correction shape, and a third sub-step of placing said optical surface at an optical path of said projection optical system.

* * * * *